(12) United States Patent
Tokunaga et al.

(10) Patent No.: US 8,624,620 B2
(45) Date of Patent: Jan. 7, 2014

(54) TEST SYSTEM AND WRITE WAFER

(75) Inventors: Yasuo Tokunaga, Gunma (JP); Yoshio Komoto, Gunma (JP)

(73) Assignee: Advantest Corporation, Tokyo (JP)

( * ) Notice: Subject to any disclaimer, the term of this patent is extended or adjusted under 35 U.S.C. 154(b) by 292 days.

(21) Appl. No.: 12/952,110

(22) Filed: Nov. 22, 2010

(65) Prior Publication Data
US 2011/0115519 A1    May 19, 2011

Related U.S. Application Data

(63) Continuation of application No. PCT/JP2008/059844, filed on May 28, 2008.

(51) Int. Cl.
*G01R 31/02* (2006.01)

(52) U.S. Cl.
USPC ........... 324/762.05; 324/762.01; 324/756.01; 324/756.03; 324/754.07; 324/754.18; 257/E21.477; 257/E21.002; 257/E23.001; 438/613; 438/11

(58) Field of Classification Search
USPC .......................... 324/762.01–762.06, 762.05
See application file for complete search history.

(56) References Cited

U.S. PATENT DOCUMENTS

| | | | | |
|---|---|---|---|---|
| 4,961,053 A * | 10/1990 | Krug | ............................... | 324/537 |
| 6,037,794 A * | 3/2000 | Yamamoto et al. | ...... | 324/750.08 |
| 6,127,837 A | 10/2000 | Yamamoto et al. | | |
| 6,181,145 B1 * | 1/2001 | Tomita et al. | ............ | 324/750.03 |
| 6,232,790 B1 * | 5/2001 | Bryan et al. | ............. | 324/754.07 |
| 6,337,577 B1 * | 1/2002 | Doherty et al. | .......... | 324/754.08 |
| 6,351,134 B2 * | 2/2002 | Leas et al. | ................ | 324/750.05 |
| 6,400,173 B1 * | 6/2002 | Shimizu et al. | .......... | 324/754.07 |
| 6,762,611 B2 * | 7/2004 | Hubner et al. | ........... | 324/756.03 |
| 6,790,684 B2 * | 9/2004 | Ahn et al. | ........................ | 438/14 |
| 6,815,231 B2 * | 11/2004 | Miura et al. | ..................... | 438/14 |
| 6,871,307 B2 * | 3/2005 | Nachumovsky | ............... | 714/718 |
| 7,208,759 B2 * | 4/2007 | Momohara | ....................... | 257/48 |
| 7,403,029 B2 * | 7/2008 | Chong et al. | ............. | 324/755.05 |

(Continued)

FOREIGN PATENT DOCUMENTS

| | | |
|---|---|---|
| JP | 1987-098234 U | 6/1987 |
| JP | 11-277252 A | 10/1999 |

(Continued)

OTHER PUBLICATIONS

International Search Report (ISR) issued in PCT/JP2008/059844 (parent application) mailed in Aug. 2008 for Examiner consideration, citing U.S. Patent Nos. 1-2 and Foreign Patent document Nos. 3-4 listed above.

(Continued)

*Primary Examiner* — Arleen M Vazquez
*Assistant Examiner* — Thang Le

(57) ABSTRACT

A test system for testing a plurality of semiconductor chips formed on a semiconductor wafer includes: a test wafer on which a plurality of test circuits corresponding to the plurality of semiconductor chips are formed, each test circuit testing a corresponding one of the plurality of semiconductor chips based on test data provided to the test circuit; where each of the plurality of test circuits includes a nonvolatile and rewritable pattern memory for storing the test data such as pattern data and sequence data, and the test system writes the same test data to all the plurality of test circuits in parallel.

10 Claims, 8 Drawing Sheets

(56) References Cited

U.S. PATENT DOCUMENTS

| | | | |
|---|---|---|---|
| 2001/0047496 A1* | 11/2001 | Hidaka et al. | 714/5 |
| 2005/0225336 A1 | 10/2005 | Kojima | |
| 2006/0221735 A1 | 10/2006 | Matsumoto | |
| 2008/0010824 A1 | 1/2008 | Kojima | |
| 2008/0048689 A1* | 2/2008 | Lee | 324/754 |
| 2008/0303173 A1* | 12/2008 | Hamada et al. | 257/777 |

FOREIGN PATENT DOCUMENTS

| | | |
|---|---|---|
| JP | 2002-222839 A | 8/2002 |
| JP | 2006287035 A | 10/2006 |
| TW | 515895 | 1/2003 |
| TW | 530360 | 5/2003 |
| TW | 1297167 | 5/2008 |
| WO | 03/062837 A1 | 7/2003 |

OTHER PUBLICATIONS

Written Opinion (PCT/ISA/237) issued in PCT/JP2008/059844 (parent application) mailed in Aug. 2008.
TW Office Action and Computer Translation Dated Dec. 20, 2012; Application No. 098114216.
TW Office Action/ Search Report and Partial English Translation Dated Oct. 15, 2012; Application No. 098114216.
JP Office Action and Machine Translation Dated Apr. 2, 2013; Application No. 2010-514287.

* cited by examiner

TEST SYSTEM AND WRITE WAFER

BACKGROUND

1. Technical Field

The present invention relates to a test system and a write wafer. In particular, the present invention relates to a test system for testing a plurality of semiconductor chips formed on a semiconductor wafer, and to a write wafer for writing the same data to all of a plurality of circuits formed on such a semiconductor wafer.

2. Related Art

An apparatus is already known to conduct a test to a semiconductor wafer in which a plurality of semiconductor chips are formed to test pass/fail of each semiconductor chip (see Japanese Patent Application Publication No. 2002-222839 for example). Such an apparatus can have a probe card that can be collectively electrically connected to a plurality of semiconductor chips.

Generally, a probe cared is formed using a printed circuit board or the like (see WO 2003/062837 for example). A plurality of probe pins formed on the printed circuit board can be collectively electrically connected to the plurality of semiconductor chips.

One method of testing a semiconductor chip uses a BOST circuit. The BOST circuit can be mounted on a probe card. When a test is conducted to a semiconductor wafer, however, a multitude of BOST circuits are required, which are difficult to be implemented on the printed circuit board of the probe card.

Another method of testing a semiconductor chip uses a BIST circuit provided in a semiconductor chip. However, this method involves formation of circuits, in the semiconductor chip, not used in the actual operation, thereby reducing the region for forming the actually operating circuits in the semiconductor chip.

In addition, the test apparatus of a semiconductor chip can be extremely large because of including a control main frame, a test head storing a plurality of test modules, a probe card to be in contact with the semiconductor chip, and so on. Therefore, it has been desired to reduce the size of a test apparatus.

Therefore, it is an object of an aspect of the innovations herein to provide a test system and a write wafer, which are capable of overcoming the above drawbacks accompanying the related art. The above and other objects can be achieved by combinations described in the claims.

SUMMARY

Therefore, it is an object of an aspect of the innovations herein to provide a test system for testing a plurality of semiconductor chips formed on a semiconductor wafer, including: a test wafer on which a plurality of test circuits corresponding to the plurality of semiconductor chips are formed, each test circuit testing a corresponding one of the plurality of semiconductor chips based on test data provided to the test circuit; where each of the plurality of test circuits includes a nonvolatile and rewritable pattern memory for storing the test data.

A second aspect of the innovations may include a write wafer for writing the same data to all of a plurality of circuits formed on a semiconductor wafer, including: a plurality of write circuits corresponding to the plurality of circuits, each write circuit writing the data to a corresponding one of the plurality of circuits; and a common storage section provided in common to the plurality of write circuits, storing the data, and supplying the data to each of the plurality of write circuits.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
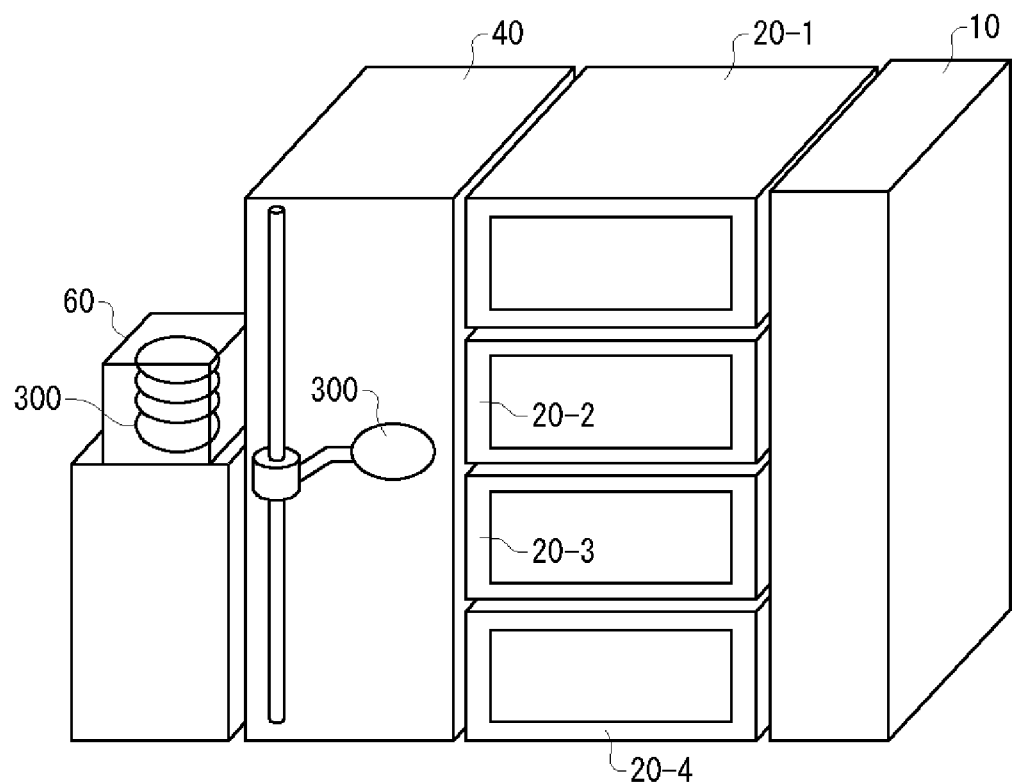
FIG. 1 shows an overview of a test system 400 according to an embodiment.

FIG. 1 shows an overview of a test system 400 according to an embodiment. The test system 400 tests a plurality of semiconductor chips formed on a semiconductor wafer 300. The test system 400 may test a plurality of semiconductor wafers 300 in parallel. The test system 400 includes a control apparatus 10, a plurality of chambers 20, a conveyance section 40, and a wafer cassette 60.

The control apparatus 10 controls the test system 400. For example, the control apparatus 10 may control the chambers 20, the conveyance section 40, and the wafer cassette 60. The chambers 20 sequentially receive the semiconductor wafers 300 to be tested, to conduct tests on the semiconductor wafers 300 within the chambers 20. Each chamber 20 may test a semiconductor wafer 300 independently from the other chambers. In other words, each chamber 20 may test a semiconductor wafer 300 without synchronizing with the other chambers 20.

The wafer cassette 60 stores therein a plurality of semiconductor wafers 300. The conveyance section 40 sequentially conveys the plurality of semiconductor wafers 300 to the chambers 20. For example, the conveyance section 40 conveys each semiconductor wafer 300 stored in the wafer cassette 60 to any one of unoccupied chambers 20. The conveyance section 40 may output a semiconductor wafer 300 after being tested, from the chamber 20 to the wafer cassette 60.

Figure 2:
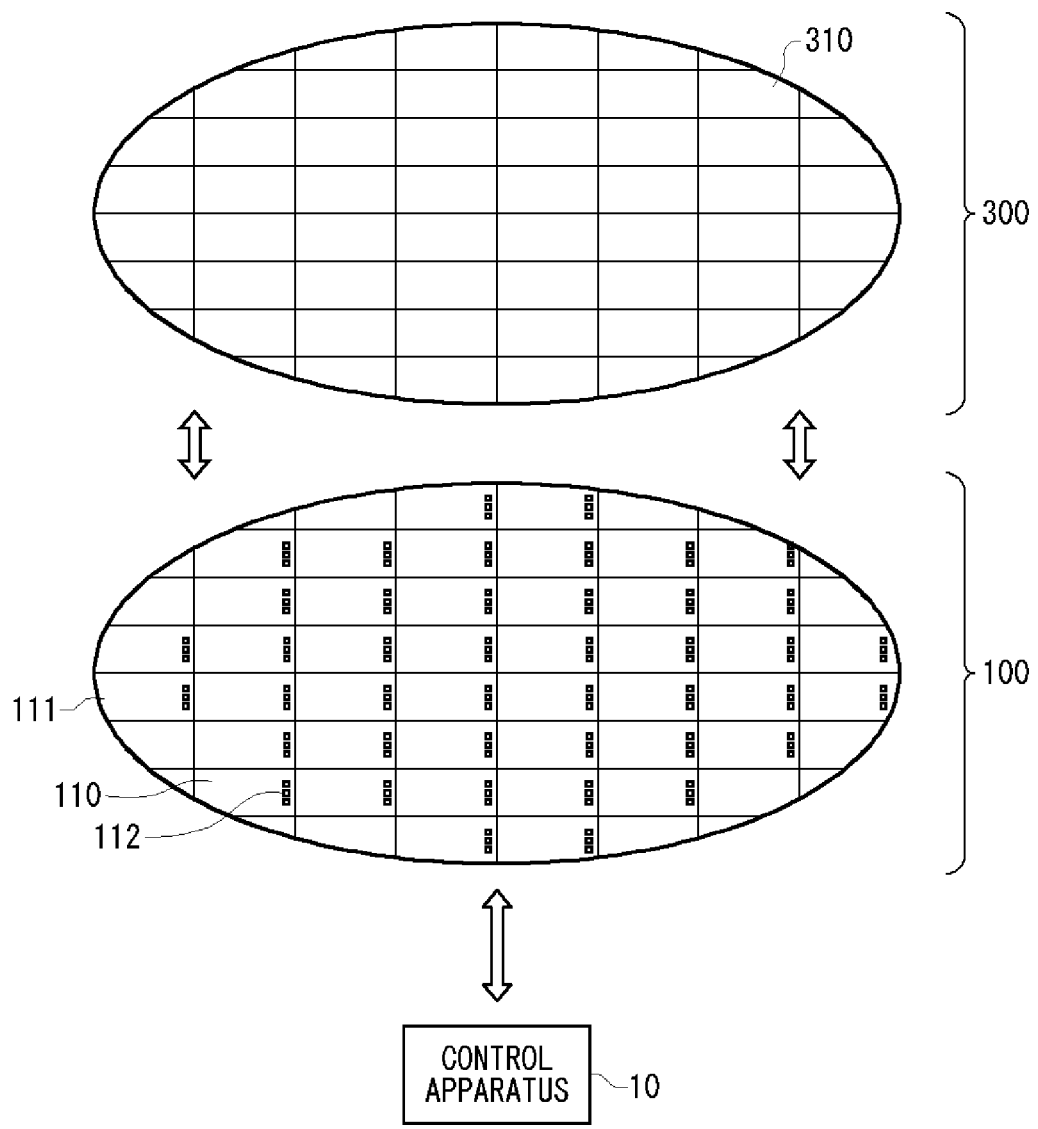
FIG. 2 explains an overview of a test performed by the test system 400.

FIG. 2 explains an overview of a test performed by the test system 400. The test system 400 uses a test wafer 100 to test each semiconductor chip 310 of a semiconductor wafer 300. Each chamber 20 of FIG. 1 is supplied with a test wafer 100 in advance.

The substrate 111 of the test wafer 100 may be formed by the same semiconductor material as the substrate of the semiconductor wafer 300 to be tested. The substrate 111 of the semiconductor wafer 300 may be a semiconductor substrate having a disk shape. More specifically, the semiconductor wafer 300 may be made of silicon, compound semiconductor, or may be other semiconductor substrates.

In addition, the test wafer 100 may have a shape corresponding to the semiconductor wafer 300. In the present document, "a corresponding shape" or similar expressions indicates that the relevant members have the same shape as each other, or that the relevant members are shaped such that one corresponds to a part of the other. For example, the test wafer 100 may have the same shape as the semiconductor wafer 300. More specifically, the test wafer 100 may be a wafer having a disk shape having substantially the same diameter as the semiconductor wafer 300. The test wafer 100 may have a shape that, when overlapped to the semiconductor wafer 300, covers a part of the semiconductor wafer 300. When the semiconductor wafer 300 has a disk shape, the test wafer 100 may have the shape of a part of the disk (e.g., semicircular shape).

By being overlapped on the semiconductor wafer 300, the test wafer 100 is collectively electrically connected to the examination pads of the plurality of semiconductor chips 310. The surface of the test wafer 100 which faces the semiconductor wafer 300 may be provided with a plurality of pads 112 that correspond to the pads of the semiconductor chips 310.

Note that the expression "electrically connection" and its derivatives in the present document may indicate to cause an electric signal conveyable between two circuits. For example, the expression may be used to contact the respective pads of the two circuits to electrically connect the two circuits, or to use signal transmission such as capacitance coupling or inductive coupling to enable non-contact electrical connection between the two circuits. In addition, a part of the signal transmission paths between the two circuits may be optical transmission paths.

The test wafer 100 includes a plurality of test circuits 110 corresponding to the plurality of semiconductor chips 310. For example, the test wafer 100 may include the plurality of test circuits 110 in one to one correspondence with the plurality of semiconductor chips 310. Each test circuit 110 may test a corresponding semiconductor chip 310 based on test data supplied in advance. For example, each test circuit 110 may generate a test signal to be supplied to a corresponding semiconductor chip 310, and determine pass/fail of a corresponding semiconductor chip 310 based on the response signal outputted from the semiconductor chip 310.

The control apparatus 10 may supply test data, a power-supply power, and a control signal to each test circuit 110. The control apparatus 10 may write the same test data to the plurality of test circuits 110 in parallel. The test wafer 100 tests the plurality of semiconductor chips 310 in parallel, by being collectively electrically connected to the plurality of semiconductor chips 310 of the semiconductor wafer 300 to be tested.

Figure 3:
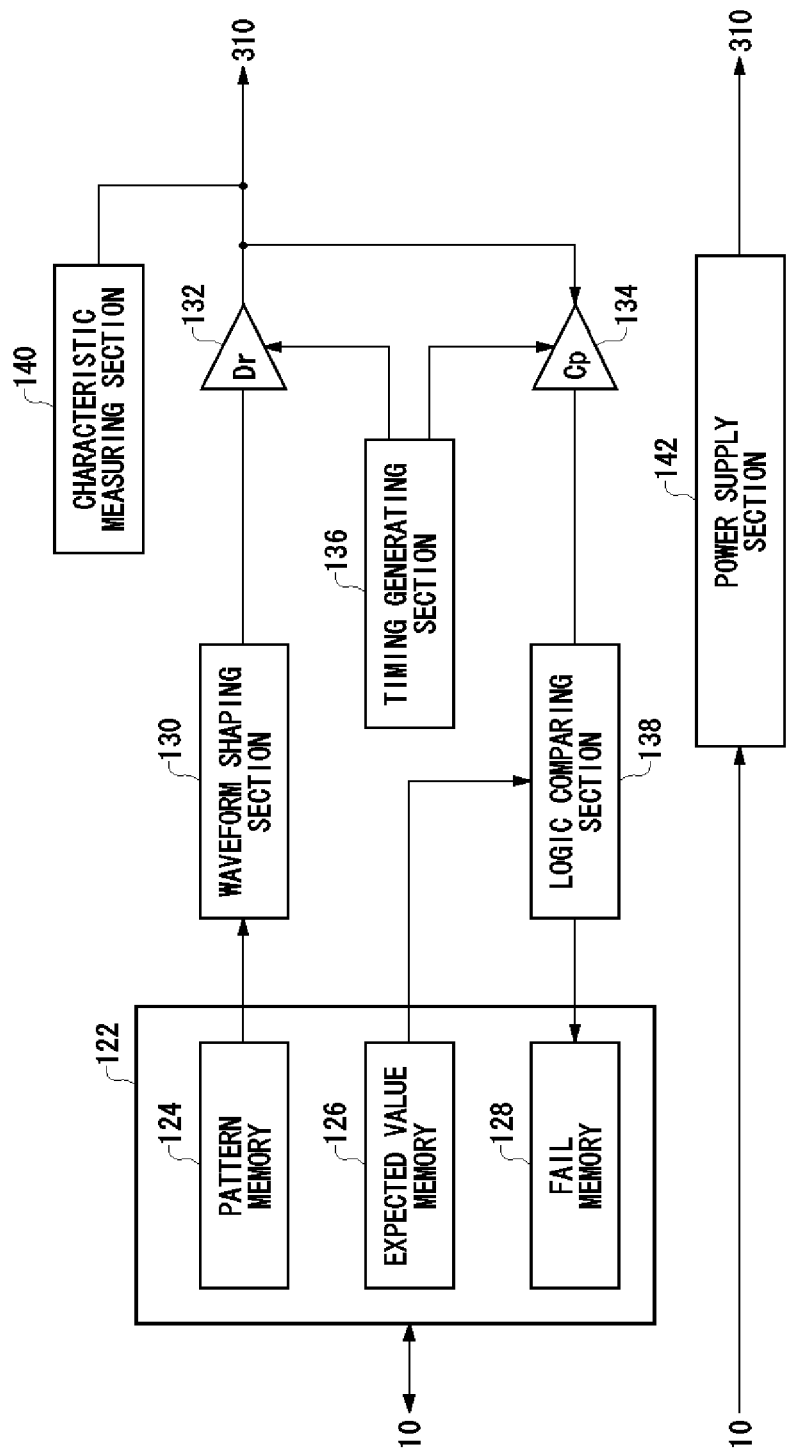
FIG. 3 shows an exemplary configuration of a test circuit 110.

FIG. 3 shows an exemplary configuration of a test circuit 110. The test circuit 110 includes a pattern generating section 122, a waveform shaping section 130, a driver 132, a comparator 134, a timing generating section 136, a logic comparing section 138, a characteristic measuring section 140, and a power supply section 142. Note that the test circuit 110 may have the configuration as shown in FIG. 3 for each input/output pin of the semiconductor chip 310 connected thereto.

The pattern generating section 122 generates a logic pattern of a test signal. The pattern generating section 122 in the present example stores test data supplied from the control apparatus 10 in advance. The test data may include pattern data and sequence data for example. The pattern data may have a predetermined logic pattern. The sequence data may determine an order to output the pattern data. The expected value data may be an expected value pattern of the logic pattern of the response signal of the semiconductor chip 310.

The pattern generating section 122 in the present example includes a pattern memory 124, an expected value memory 126, and a fail memory 128. The pattern memory 124 stores test data supplied from the control apparatus 10. The pattern memory 124 may be a nonvolatile and rewritable memory. For example, the pattern memory 124 may be a semiconductor memory formed in the test wafer 100. The test wafer 100 can conduct a plurality of kinds of tests by rewriting the test data stored in the pattern memory 124.

For example, the pattern generating section 122 may output a logic pattern based on the pattern data and the sequence data pre-stored in the pattern memory 124. The pattern memory 124 may store test data supplied from the control apparatus 10 prior to starting of a test. The pattern generating section 122 may also generate the logic pattern based on an algorithm supplied from the control apparatus 10 as the test data in advance.

The waveform shaping section 130 shapes the waveform of a test signal based on the logic pattern supplied from the pattern generating section 122. For example, the waveform shaping section 130 may shape the waveform of a test signal by outputting the voltage corresponding to each logic value of the logic pattern for each predetermined bit period.

The driver 132 outputs a test signal corresponding to the waveform supplied from the waveform shaping section 130. The driver 132 may output a test signal corresponding to the timing signal supplied from the timing generating section 136. The driver 132 may output a test signal having the same period as that of the timing signal. The test signal outputted from the driver 132 is supplied to the corresponding semiconductor chip 310 via a switch section or the like.

The comparator 134 measures a response signal outputted from a semiconductor chip 310. For example, the comparator 134 may measure the logic pattern of a response signal by sequentially detecting the logic values of the response signal according to the strobe signals supplied from the timing generating section 136.

The logic comparing section 138 functions as a judging section that judges the pass/fail of the corresponding semiconductor chip 310 based on the logic pattern of the response signal measured by the comparator 134. The logic comparing section 138 may judge the pass/fail of a semiconductor chip 310 by examining whether the expected value pattern supplied from the pattern generating section 122 matches the logic pattern detected by the comparator 134. The pattern generating section 122 may supply, to the logic comparing section 138, the expected value pattern pre-stored in the expected value memory 126. The expected value memory 126 may store a logic pattern supplied from the control apparatus 10 prior to starting of a test. The pattern generating section 122 may also generate the expected value pattern based on an algorithm supplied in advance.

The fail memory 128 stores a comparison result of the logic comparing section 138. When testing a memory region of a semiconductor chip 310, the fail memory 128 may store the pass/fail judgment result of the logic comparing section 138, for each address of the semiconductor chip 310. The control apparatus 10 may read the pass/fail judgment result stored in the fail memory 128.

The characteristic measuring section 140 measures the waveform of the voltage or the current outputted from the driver 132. The characteristic measuring section 140 may judge the pass/fail of a semiconductor chip 310 by examining whether the waveform of the current or the voltage supplied form the driver 132 to the semiconductor chip 310 satisfies a predetermined specification.

The power supply section 142 supplies the power-supply power for driving a semiconductor chip 310. The power supply section 142 may supply, to the semiconductor chip 310, the power-supply power corresponding to the power supplied from the control apparatus 10 during a test. The power supply section 142 may supply a driving power to each constituting element of a test circuit 110.

The explained configuration of the test circuits 110 helps realize a test system 400 having a control apparatus 10 of a reduced size. An exemplary control apparatus 10 is a general personal computer. In addition, rewriting the test data stored in the pattern memory 124 enables to conduct various tests by using a single test wafer 100.

Figure 4:
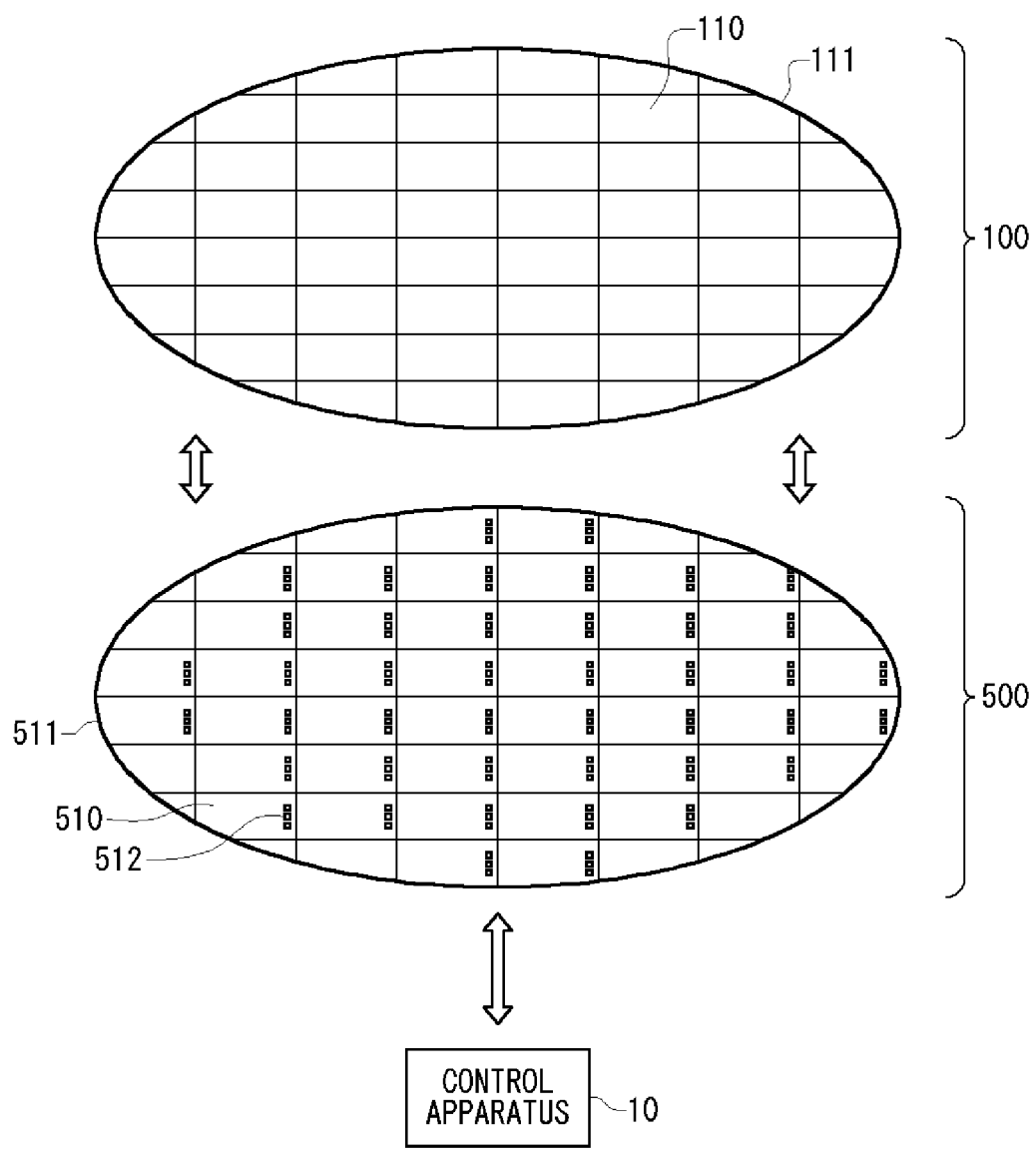
FIG. 4 shows an example of a write wafer 500 to write test data to each test circuit 110 of a test wafer 100.

FIG. 4 shows an example of a write wafer 500 to write test data to each test circuit 110 of a test wafer 100. The write wafer 500 writes the test data, which has been supplied from the control apparatus 10, to the plurality of test circuits 110 in parallel.

The write wafer 500 in the present example includes a plurality of write circuits 510 and a substrate 511. The substrate 511 may be formed by the semiconductor material as the substrate 111 of the test wafer 100. The substrate 511 may also have substantially the same diameter as the substrate 111. The plurality of write circuits 510 may be formed on the substrate 511 by a semiconductor process such as exposure.

The plurality of write circuits 510 are provided in correspondence to the plurality of test circuits 110. For example, the plurality of write circuits 510 may be provided in one to one correspondence with the plurality of test circuits 110. Each write circuit 510 is formed on the substrate 511 so that each write circuit 510 faces a corresponding test circuit 110 when the write wafer 500 is overlapped on the test wafer 100.

Accordingly, each write circuit 510 is electrically connected to the test circuit 110 when the write wafer 500 is overlapped on the test wafer 100. Then, each write circuit 510 writes test data to the corresponding test circuit 110. Each write circuit 510 may be provided with a pad 512 to be electrically connected to the pad of the corresponding test circuit 110. By using the write wafer 500, test data can be collectively written on the test circuits 110 of the test wafer 100.

Figure 5:
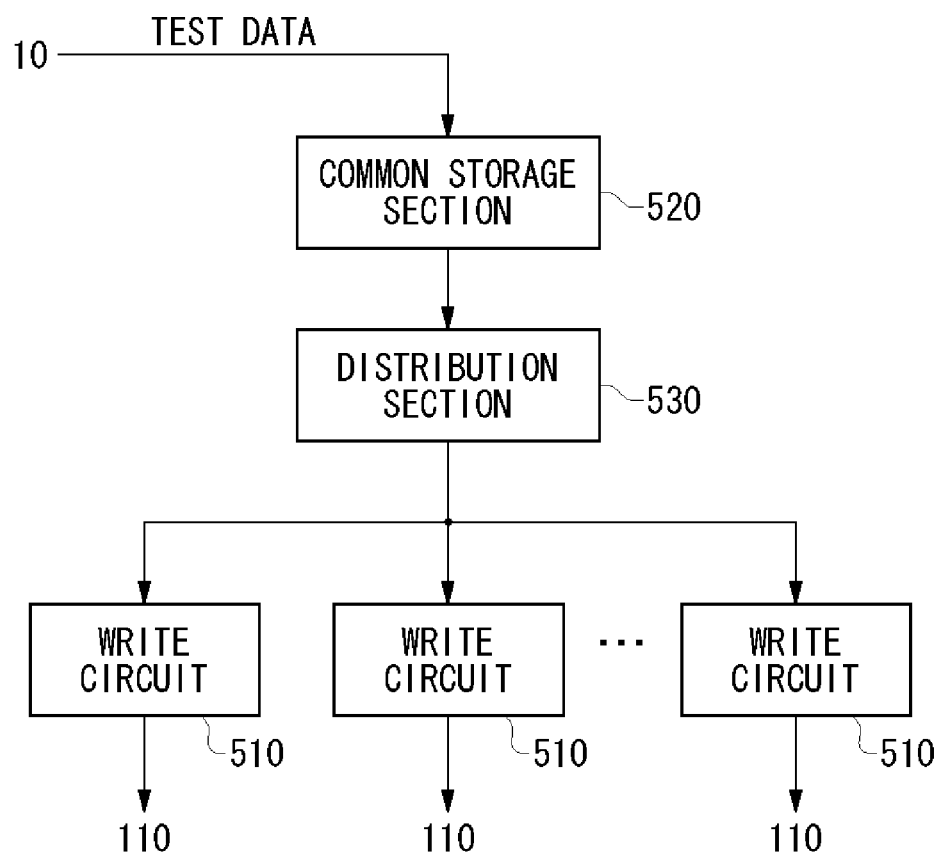
FIG. 5 is a block diagram showing an exemplary functional configuration of the write wafer 500.

FIG. 5 is a block diagram showing an exemplary functional configuration of the write wafer 500. The write wafer 500 in the present example includes a common storage section 520, a distribution circuit 530, and a plurality of write circuits 510. As shown in FIG. 4, the plurality of write circuits 510 may be formed on a surface facing the test wafer 100. The common storage section 520 and the distribution circuit 530 may be formed on the surface facing the test wafer 100, or formed on the rear surface of the surface facing the test wafer 100.

The common storage section 520 is provided in common to the plurality of write circuits 510, and stores test data. For example, the common storage section 520 may store test data supplied from the control apparatus 10. In this case, the common storage section 520 may be a nonvolatile and rewritable memory.

The common storage section 520 may also be a ROM to which predetermined test data is written. In this case, the test data may be written to the test wafer 100, by using a write wafer 500 corresponding to the test data.

The distribution circuit 530 distributes the supplied test data to each write circuit 510. The distribution circuit 530 in the present example is provided with test data from the common storage section 520. When the write wafer 500 does not include the common storage section 520, the test data supplied from the control apparatus 10 may be provided by the distribution circuit 530 to each write circuit 510.

Each write circuit 510 writes the supplied test data to a corresponding test circuit 110. Each write circuit 510 generates a control signal that causes the pattern memory 124 of the test circuit 110 to be able to write data, and supplies the generated control signal to the test circuit 110. According to the stated configuration, the test data can be collectively written to the plurality of test circuits 110.

In addition, the write circuits 510 may be respectively provided with different test data from each other. For example, the distribution circuit 530 may select one or more write circuits 510 for the same test data, to provide the same test data to the selected write circuit(s) 510.

Figure 6:
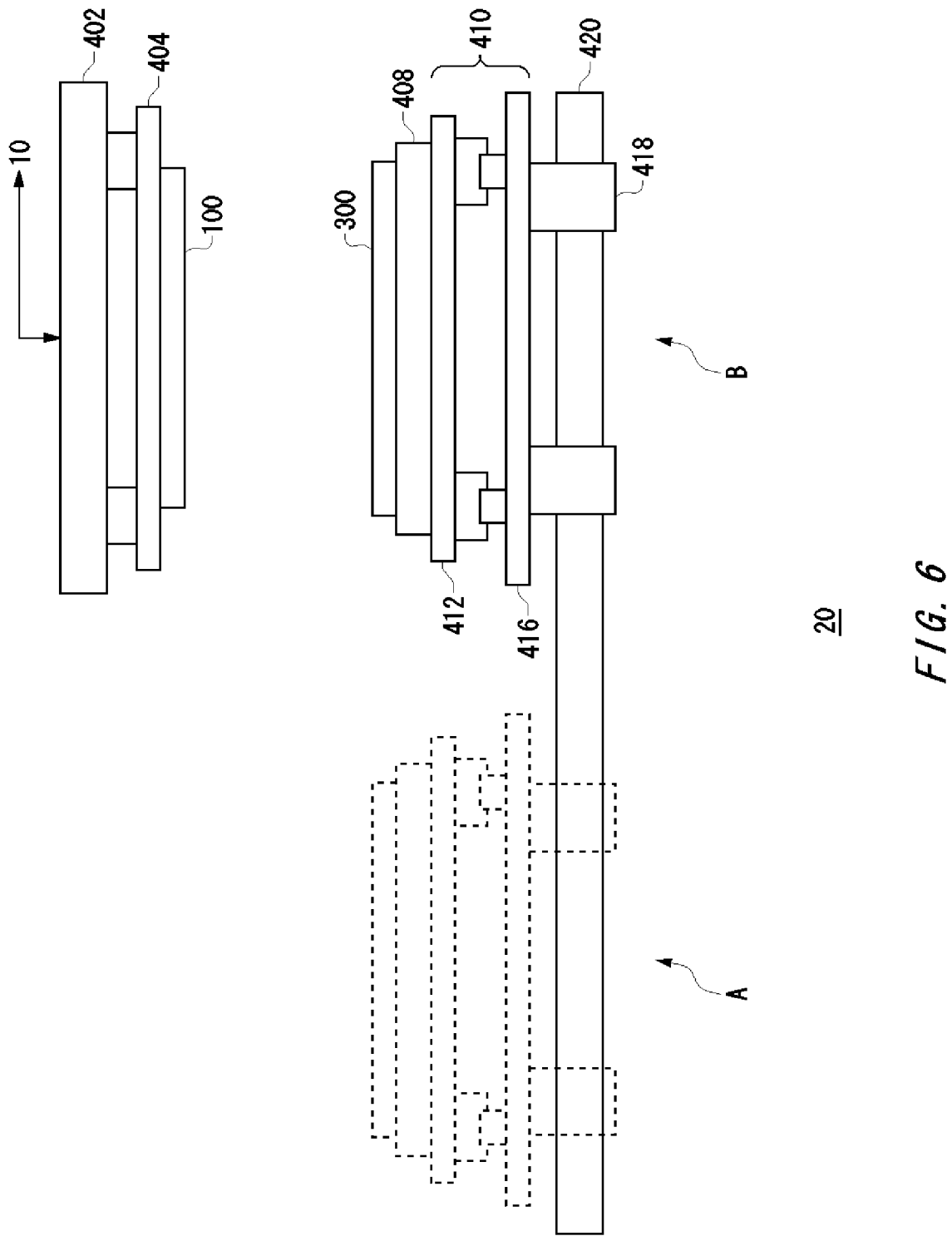
FIG. 6 shows an exemplary internal structure of a chamber 20.

FIG. 6 shows an exemplary internal structure of a chamber 20. The semiconductor wafers 300 to be tested are sequentially conveyed into the chamber 20, which is then electrically connected to the test wafer 100 fixedly installed in the chamber 20. The test wafer 100, the wire substrate 404, the motherboard 402, the wafer tray 408, the wafer stage 410, the guide 420, and the stage support 418 are provided inside the chamber 20.

The test wafer 100 is fixed inside the chamber 20. In the present example, the test wafer 100 is fixed to the wire substrate 404 in the chamber 20. The wire substrate 404 may be a printed circuit board provided with wiring. The wire substrate 404 may be fixed to the motherboard 402 in the chamber 20. The motherboard 402 conveys a signal between the control apparatus 10 and the test wafer 100 via the wire substrate 404. The test wafer 100 is collectively electrically connected to the pads of the plurality of semiconductor chips 310 formed on the semiconductor wafer 300.

The wafer stage 410, mounting thereon the semiconductor wafer 300, moves into the chamber 20. In the present example, the semiconductor wafer 300 is attached to the wafer tray 408 by suction force or the like, and the wafer stage 410 mounts thereon the wafer tray 408. The wafer stage 410 is connected to the guide 420 via the stage support 418, and moves along the guide 420.

For example, the guide 420 moves the wafer stage 410 between a position A at which the semiconductor wafer 300 is received from the conveyance section 40, and a predetermined position B facing the test wafer 100, via a predetermined route. The guide 420 may be a rail provided along the predetermined route.

The wafer stage 410, after moving to the predetermined position B facing the test wafer 100, moves the semiconductor wafer 300 in the vertical direction to electrically connect it to the test wafer 100. The wafer stage 410 includes a horizontal stage 412 and a vertical stage 416.

The horizontal stage 412 mounts thereon the wafer tray 408, and adjusts the position of the semiconductor wafer 300 in the plane horizontal to the surface of the semiconductor wafer 300. The vertical stage 416 mounts thereon the horizontal stage 412, and controls the vertical position of the horizontal stage 412. For example, the vertical stage 416 may electrically connect the semiconductor wafer 300 and the test wafer 100, by causing the horizontal stage 412 mounting thereon the semiconductor wafer 300 to approach the test wafer 100 at the position facing the test wafer 100. A stage support 418 may be fixed to the vertical stage 416.

According to the stated configuration, the semiconductor wafer 300 conveyed into the chamber 20 is electrically connected to the test wafer 100, to conduct a test on the semiconductor wafer 300. When writing test data to each test circuit 110 of the test wafer 100, the conveyance section 40 of FIG. 1 may convey the write wafer 500 into the chamber 20.

In addition, inside the chamber 20, the write wafer 500 writes test data to each test circuit 110 of the test wafer 100. For example, the write wafer 500 may write the test data to each test circuit 110 by supplying the test circuit 110 with an electric signal corresponding to the test data. The write wafer 500 may be electrically connected to the test wafer 100 in the chamber 20, in the same method as adopted by the semiconductor wafer 300. In another example, the write wafer 500 may write test data to a pattern memory 124 such as UV-EPROM provided in the test circuit 110, by using an ultraviolet light irradiation apparatus for example.

In this case, the control apparatus 10 may supply, to each test circuit 110 of the test wafer 100, a control signal for reading the test data from the write circuit 510. The control apparatus 10 may be electrically connected to the test wafer 100 via the wire substrate 404 and the motherboard 402 from outside the chamber 20. The control apparatus 10 may supply, via the test wafer 100, a power-supply power of the write wafer 500. Under such a control, the test data can be collectively written to each test circuit 110 of the test wafer 100.

In addition, the control apparatus 10 may write the test data to each test circuit 110 of the test wafer 100, without using the write wafer 500. For example, the control apparatus 10 may write the test data to each test circuit 110 of the test wafer 100 via the wire substrate 404 and the motherboard 402. Also under such a control, the test data can be collectively written to each test circuit 110 of the test wafer 100.

For example, the control apparatus 10 may write the test data to each test circuit 110 by supplying the test circuit 110 with an electric signal corresponding to the test data. In another example, the control apparatus 10 may write test data to a pattern memory 124 such as UV-EPROM provided in the test circuit 110, by controlling an ultraviolet light irradiation apparatus provided on the wire substrate 404 for example.

Figure 7:
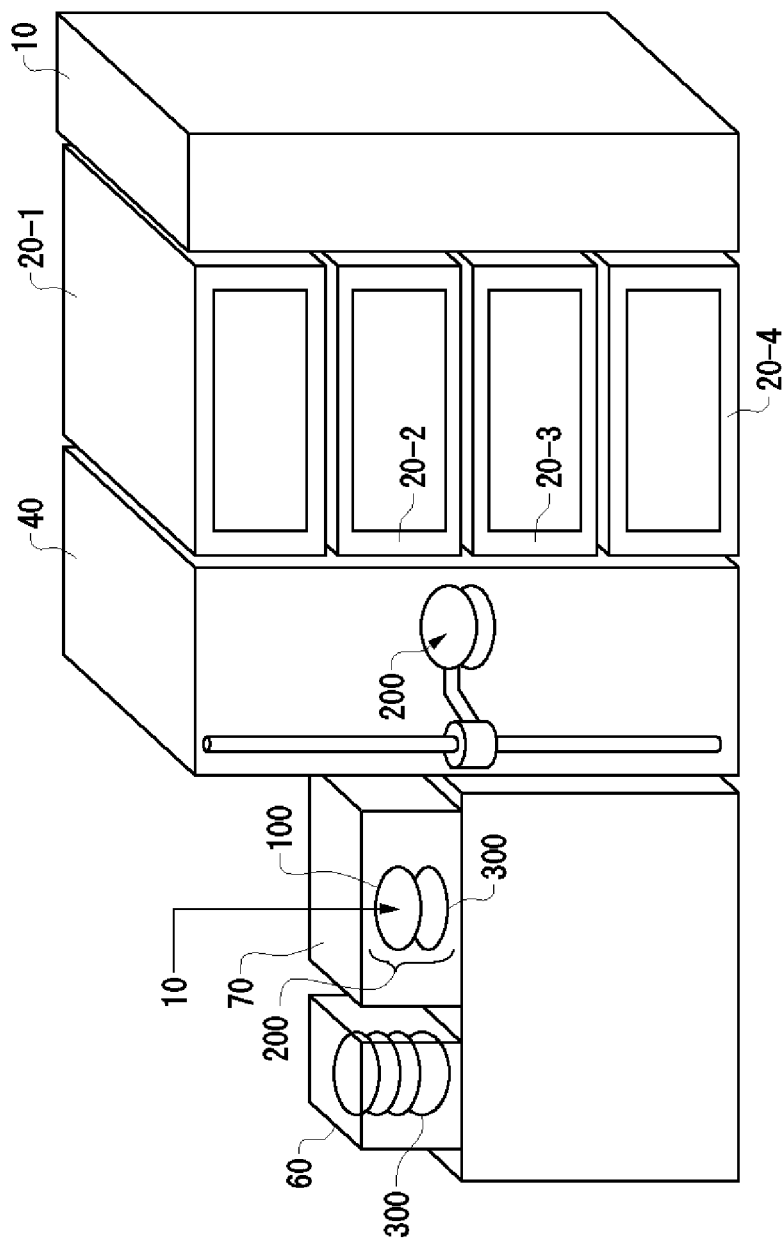
FIG. 7 shows an overview of a test system 400 according to another embodiment.

FIG. 7 shows an overview of a test system 400 according to another embodiment. The test system 400 of the present example electrically connects the test wafer 100 to the semiconductor wafer 300 outside the chamber 20, and conveys the test wafer 100 and the semiconductor wafer 300 into the chamber 20. The test system 400 of the present example further includes a wafer fixing section 70 in addition to the configuration of the test system 400 explained with reference to FIG. 1.

The wafer fixing section 70 integrally fixes the test wafer 100 to which the test data has been written, to the semiconductor wafer 300, in the state in which both of the wafers are in electrical connection, thereby forming an integral wafer unit 200. For example, the wafer fixing section 70 may create a hermetically sealed space between the test wafer 100 and the semiconductor wafer 300, to maintain the hermetically sealed space in the decompressed state, to form the wafer unit 200 in which the test wafer 100 and the semiconductor wafer 300 are electrically connected to each other.

The test data may be supplied to each test circuit 110 of the test wafer 100 in advance. For example, inside the wafer fixing section 70, the test data supplied from the control apparatus 10 may be written to each test circuit 110 of the test wafer 100. For example, the control apparatus 10 may supply test data to each test circuit 110 using the write wafer 500 inside the wafer fixing section 70. In this case, prior to being integrally fixed to the semiconductor wafer 300, the test wafer 100 may receive the test data from the write wafer 500. Alternatively, the control apparatus 10 may write the test data to the test wafer 100 in a different method.

The conveyance section 40 conveys the wafer unit 200 formed in the wafer fixing section 70, to inside each chamber 20. Inside the chamber 20, the semiconductor wafer 300 is tested using the test wafer 100. For example, the semiconductor wafer 300 may be tested by connecting the test wafer 100 to the control apparatus 10 via the wire substrate 404 explained with reference to FIG. 6.

The conveyance section 40 may output the wafer unit 200 having finished the test in the chamber 20, from the chamber 20 to the wafer fixing section 70. The wafer fixing section 70 separates the test wafer 100 from the semiconductor wafer 300 in the wafer unit 200 inputted from the conveyance section 40, and forms a new wafer unit 200 by the next semiconductor wafer 300 to be tested and the test wafer 100.

During this process, the control apparatus 10 may write, to the test wafer 100, the test data corresponding to the next test to be conducted. According to the stated configuration, various tests can be conducted using a single test wafer 100.

In addition, the test system 400 may be provided with more test wafers 100 in number than the chambers 20. In this case, at least one test wafer 100 should be in wait state outside the chambers 20. To this test wafer 100 in wait state, the control apparatus 10 may write, in advance, the test data corresponding to the next semiconductor wafer 300 to be tested. In addition, the wafer fixing section 70 may form, in advance, a wafer unit 200 by the test wafer 100 to which the test data has been written and the next semiconductor wafer 300 to be tested. This configuration allows efficient testing of the semiconductor wafers 300.

Figure 8:
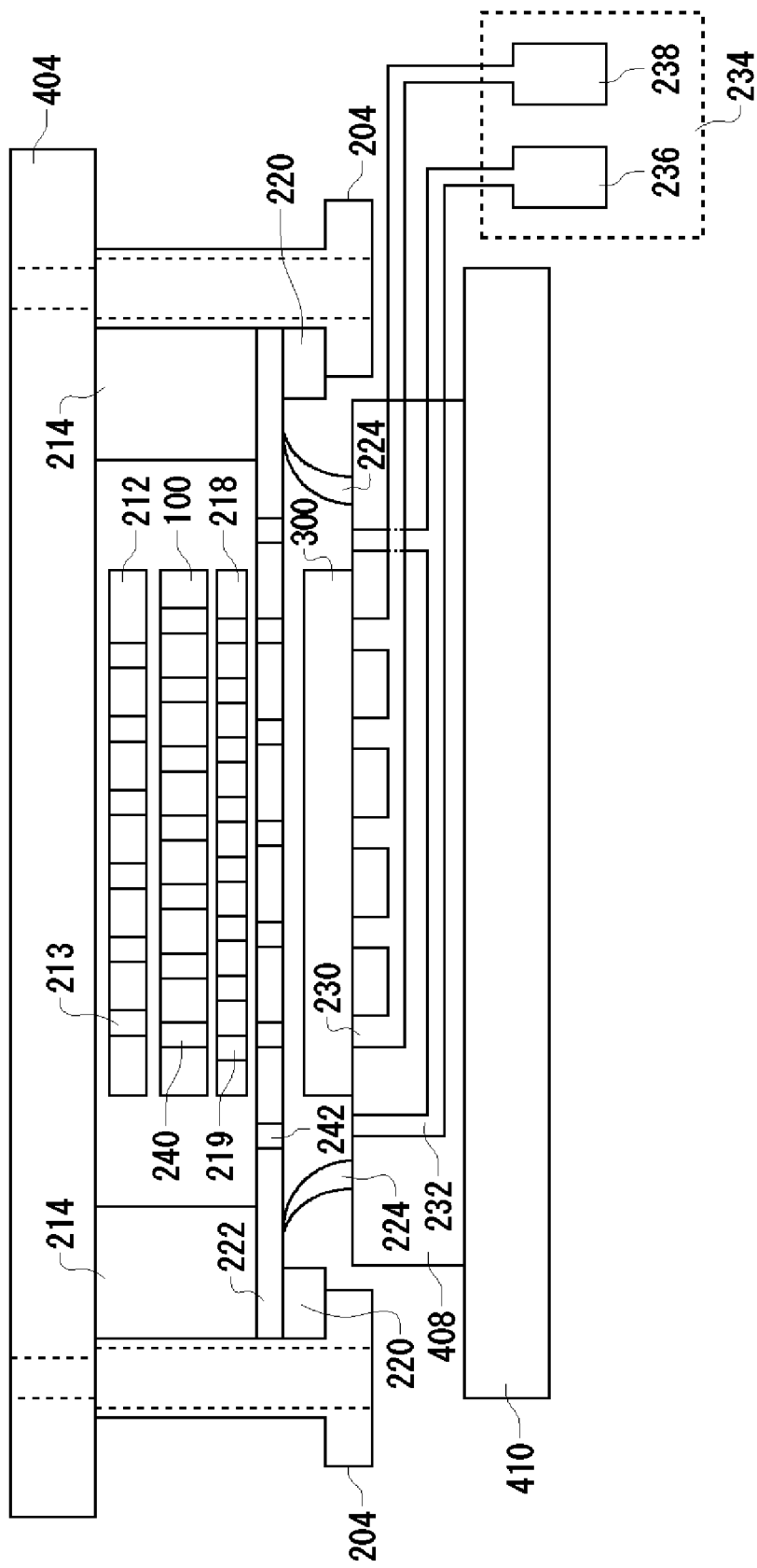
FIG. 8 shows an exemplary configuration of a wafer unit 200.

FIG. 8 shows an exemplary configuration of a wafer unit 200. As already described, the wafer fixing section 70 decompresses the hermetically sealed space between the test wafer 100 and the semiconductor wafer 300, to cause the test wafer 100 to approach the semiconductor wafer 300, to electrically connect them.

In the present example, the test wafer 100 is fixed to the wire substrate 404, and the semiconductor wafer 300 is mounted on the wafer tray 408. In addition, a sealing member is provided between the wire substrate 404 and the wafer tray 408, for forming a hermetically sealed space.

Specifically, the test wafer 100 is fixed to the wire substrate 404 by means of the support 204. The support 204 fixes, to the wire substrate 404, an apparatus anisotropic conductive sheet 212, an apparatus sealing section 214, a test wafer 100, a wafer anisotropic conductive sheet 218, a membrane 222, and a fixing ring 220.

The apparatus anisotropic conductive sheet 212 is provided between the test wafer 100 and the wire substrate 404. By being pressed therebetween, the apparatus anisotropic conductive sheet 212 electrically connects the electrode of the test wafer 100 to the electrode of the wire substrate 404. The test wafer 100 is supported such that the position thereof in the vertical direction can be displaced with respect to the lower surface of the wire substrate 404 in a pre-determined range so as to be electrically connected with the wire substrate 404 by pressing the apparatus anisotropic conductive sheet 212.

The apparatus sealing section 214 is provided along the periphery of the surface of the membrane 222 nearer the wire substrate 404, and seals between the periphery of the surface of the membrane 222 nearer the wire substrate 404 and the wire substrate 404. The apparatus sealing section 214 may be formed by an elastic material having sufficient elasticity to displace the membrane 222 for creating conduction between the test wafer 100 to the wire substrate 404 via the apparatus anisotropic conductive sheet 212.

The wafer anisotropic conductive sheet 218 is provided between the test wafer 100 and the membrane 222. By being pressed, the wafer anisotropic conductive sheet 218 electrically connects wafer connection terminals provided on the surface of the test wafer 100 facing the semiconductor wafer 300, to bump terminals of the membrane 222.

The membrane 222 is provided between the wafer anisotropic conductive sheet 218 and the semiconductor wafer 300. The membrane 222 may include the bump terminals for electrically connecting the terminals of the semiconductor wafer 300 to the wafer connection terminals of the test wafer 100. The fixing ring 220 fixes the membrane 222 to the apparatus sealing section 214. The apparatus anisotropic conductive sheet 218, the test wafer 100, and the wafer anisotropic conductive sheet 218 are provided between the membrane 222 and the wire substrate 404, and are held at a predetermined position with respect to the wire substrate 404 by means of the membrane 222. As shown in FIG. 8, a gap may be provided respectively between the apparatus anisotropic conductive sheet 212, the test wafer 100, the wafer anisotropic conductive sheet 218, and the apparatus sealing section 214.

For example, the fixing ring 220 may be provided in an annular formation along the periphery of the surface of the membrane 222 nearer the semiconductor wafer 300. The inner diameter of the fixing ring 220 may be larger than the diameter of the wafer anisotropic conductive sheet 218 and the diameter of the semiconductor wafer 300. The membrane 222 has a circular form having substantially the same diameter as the fixing ring 220, and the end of the membrane 222 is fixed to the fixing ring 220.

The support section 204 may support the membrane 222 by supporting the fixing ring 220. For example, the support section 204 may support the lower end of the fixing ring 220 at a position distant from the lower surface of the wire substrate 404 by a predetermined distance, so that the lower end of the fixing ring 220 will not be distant from the lower surface of the wire substrate 404 more than the predetermined distance.

The wafer tray 408 forms a hermetically sealed space in cooperation with the wire substrate 404. The wafer tray 408 in the present example forms a hermetically sealed space in cooperation with the wire substrate 404, the apparatus sealing section 214, and the wafer sealing section 224. The wafer tray 408 mounts thereon the semiconductor wafer 300 on the surface thereof nearer the hermetically sealed space.

The wafer sealing section 224 is provided on the surface of the wafer tray 408, so as to be along the area corresponding to the periphery of the membrane 222, to seal between the periphery of the surface of the membrane 222 nearer the wafer tray and the wafer tray 408. The wafer sealing section 224 may be formed in an annular formation on the surface of the wafer tray 408.

The wafer sealing section 224 may be formed in a lip-like formation so that the diameter of the annular formation enlarges as the distance from the surface of the wafer tray 408 increases. When the wafer sealing section 224 is pressed against the membrane 222, the pressuring force curves the tip thereof, thereby causing the membrane 222 to approach the semiconductor wafer 300. The wafer sealing section 224 is formed so that the height thereof, in a state where it is not pressed against the membrane 222, from the surface of the wafer tray 408 is larger than the height of the semiconductor wafer 300.

The decompression section 234 decompresses a hermetically sealed space between the wire substrate 404 and the wafer tray 408, which is formed by the wire substrate 404, the wafer tray 408, the apparatus sealing section 214, and the wafer sealing section 224. As a result, the decompression section 234 causes the wafer tray 408 to move to a predetermined position from the wire substrate 404. The wafer tray 408, by being placed in the predetermined position, applies the pressure onto the apparatus anisotropic conductive sheet 212 and the wafer anisotropic conductive sheet 218, to electrically connect the wire substrate 404 and the test wafer 100, as well as electrically connecting the test wafer 100 and the semiconductor wafer 300.

In addition, the wafer sealing section 224 may contact the membrane 222, at the inside of the fixing ring 220. In this case, the membrane 222 separates the hermetically sealed space between the wire substrate 404 side and the wafer tray 408 side. Therefore, it is desirable to provide the membrane 222 with penetrating holes 242 connecting these spaces.

In addition, the test wafer 100, the apparatus anisotropic conductive sheet 212, and the wafer anisotropic conductive sheet 218 may also be desirably provided with penetrating holes 240, penetrating holes 213, and penetrating holes 219 respectively. The penetrating holes provided through the membrane 222, the test wafer 100, the apparatus anisotropic conductive sheet 212, and the wafer anisotropic conductive sheet 218 are desirably dispersed substantially uniformly within respective surfaces. According to such a configuration, the air absorbed during decompression of the hermetically sealed space is dispersed to flow via the multitude of penetrating holes. Note that the penetrating holes 242, the penetrating holes 240, the penetrating holes 213, and the penetrating holes 219 may also be provided correspond to each other in position, or may be provided at respectively different positions.

Therefore, during decompression of the hermetically sealed space, the pressure applied on the apparatus anisotropic conductive sheet 212 and the wafer anisotropic conductive sheet 218 is dispersed substantially uniformly within respective surfaces, thereby substantially reducing the stress distortion during the decompression. This helps prevent the cracking of the test wafer 100 or the distortion of the anisotropic conductive sheets, or the like. In addition, the penetrating holes 242 provided for the membrane 222 enable a single decompression section 234 to decompress the space between the wire substrate 404 and the test wafer 100 as well as the space between the test wafer 100 and the semiconductor wafer 300, to electrically connect them each other.

The decompression section 234 may also cause the semiconductor wafer 300 to attach by suction to the wafer tray 408. The decompression section 234 in the present example includes a decompressor 236 for hermetically sealed space, and a decompressor 238 for semiconductor wafer. In addition, the wafer tray 408 is provided with an air inlet path 232 for hermetically sealed space and an air inlet path 230 for semiconductor wafer.

The stated configuration enables to electrically connect the test wafer 100 fixed to the wire substrate 404, to the semiconductor wafer 300. In this state in which the test wafer 100 is electrically connected to the semiconductor wafer 300, the air inlet path 232 for hermetically sealed space and the air inlet path 230 for semiconductor wafer are sealed, to fix the test wafer 100 to the semiconductor wafer 300.

The wafer unit 200 is formed according to the stated configuration, to convey the test wafer 100 and the semiconductor wafer 300. Moreover, the test wafer 100 is easily separated from the semiconductor wafer 300, by simply removing the sealing between the air inlet path 232 for hermetically sealed space and the air inlet path 230 for semiconductor wafer.

Note that the same method explained with reference to FIG. 8 can also be used in the example explained with reference to FIG. 6, to electrically connect the test wafer 100 to the semiconductor wafer 300. In this case, the vertical stage 416 may move the wafer tray 408 in the vertical direction, to bring the wafer sealing section 224 in close contact to the membrane 222. The decompressing section 234 decompresses the hermetically sealed space formed by the close contact between the wafer sealing section 224 and the membrane 222.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As clear from the above description, the embodiment(s) of the present invention realizes a test system for testing a plurality of semiconductor chips formed on a semiconductor wafer, and a write wafer for writing same data to a plurality of circuits formed on such a semiconductor wafer.

What is claimed is:

1. A test system for testing a plurality of semiconductor chips formed on a semiconductor wafer, comprising:
   a test wafer on which a plurality of test circuits corresponding to the plurality of semiconductor chips are formed, each test circuit testing a corresponding one of the plurality of semiconductor chips based on test data provided to the test circuit;
   a write wafer including a plurality of write circuits, each write circuit writing the test data to a corresponding one of the plurality of test circuits; and
   a control apparatus operable to supply the test data to each write circuit;
   wherein each of the plurality of test circuits includes a nonvolatile and rewritable pattern memory for storing the test data.

2. The test system according to claim 1, further comprising:
   a control apparatus that writes substantially similar test data to each of the plurality of write circuits in parallel.

3. The test system according to claim 1, wherein the write wafer further includes a distribution circuit for distributing the test data supplied to the distribution circuit, to each of the plurality of write circuits, and the control apparatus supplies the test data to the distribution circuit.

4. The test system according to claim 2, further comprising:
   a chamber that stores a wire substrate to which the test wafer is fixed, the chamber operable to supply a signal from the test wafer to the semiconductor wafer conveyed into the chamber, and test the semiconductor wafer, wherein the control apparatus writes the test data to each of the plurality of write circuits from outside the chamber via the wire substrate.

5. The test system according to claim 1, further comprising:
   a chamber that stores a wire substrate to which the test wafer is fixed, the chamber operable to supply a signal from the test wafer to the semiconductor wafer conveyed into the chamber, and test the semiconductor wafer,
   wherein for writing the test data to the test wafer, the control apparatus conveys, into the chamber, the write wafer storing thereon the test data, and writes the test data to each of the plurality of test circuits of the test wafer from the write wafer.

6. The test system according to claim 1, wherein the write wafer further includes a common storage section, the common storage section being provided in common to the plurality of write circuits, storing the test data, and supplying the test data to each of the plurality of write circuits.

7. The test system according to claim 2, further comprising:
   a wafer fixing section that integrally fixes the semiconductor wafer and the test wafer, the wafer fixing section including the write wafer; and
   a chamber into which the test wafer and the semiconductor wafer integrally fixed to each other by the wafer fixing section are conveyed, the chamber testing the semiconductor wafer using the test wafer.

8. The test system according to claim 7, wherein the control apparatus writes, to the write wafer for the test wafer outputted from the chamber, test data corresponding to a next test to be conducted.

9. An apparatus for writing substantially similar test data to each of a plurality of test circuits formed on a test wafer, each test circuit testing a corresponding semiconductor chip of a plurality of semiconductor chips formed on a semiconductor wafer based on the test data written to the test circuit, the apparatus comprising:
   a write wafer including a plurality of write circuits corresponding to the plurality of test circuits, each write circuit writing the test data to a corresponding one of the plurality of test circuits, the test data allowing each test circuit to generate a test signal for testing a corresponding semiconductor chip of the plurality of semiconductor chips; and
   a common storage section in communication with the plurality of write circuits, the common storage section storing the test data, and supplying the test data to each of the plurality of write circuits.

10. A method comprising:
    receiving, at each of a plurality of write circuits included in a write wafer, test data from a control apparatus, the test data allowing each of a plurality of test circuits included in a test wafer to generate a test signal;
    writing the test data from each of the plurality of write circuits to a corresponding test circuit of the plurality of test circuits; and
    testing a corresponding semiconductor chip of a plurality of semiconductor chips included in a semiconductor wafer using the test signal.

* * * * *